United States Patent [19]
Perlmutter

[11] 3,936,744
[45] Feb. 3, 1976

[54] AUTOMOTIVE ALTERNATOR AND SOLID STATE REGULATOR TESTER

[76] Inventor: David Perlmutter, 98 Harrison Ave., Island Park, N.Y. 11558

[22] Filed: Apr. 30, 1974

[21] Appl. No.: 465,600

[52] U.S. Cl............ 324/158 R; 324/28 R; 324/73 R
[51] Int. Cl.² .................... G01R 15/12; G01R 31/02
[58] Field of Search ............ 324/158 R, 73 R, 28 R, 324/158 MG

[56] References Cited
UNITED STATES PATENTS

| | | | |
|---|---|---|---|
| 2,826,737 | 3/1958 | Crumbliss | 324/73 R |
| 3,142,797 | 7/1964 | Grant | 324/28 R |
| 3,745,456 | 7/1973 | Kahler | 324/73 R |

Primary Examiner—R. V. Rolinec
Assistant Examiner—Ernest F. Karlsen
Attorney, Agent, or Firm—Bauer, Amer & King

[57] ABSTRACT

A tester for a solid state voltage regulator includes two parallel branches available for interconnection to the two output contacts of the voltage regulator. The two branches both interconnect to the high voltage side of a battery. One of the branches includes a resistor in parallel combination with an indicator bulb. One of the branches includes a normally open switch. For use with automobile alternators having a built-in regulator, the tester can be connected directly to the regulator and test both the regulator and the alternator. When the regulator is independent of the alternator, it can be tested by itself by using actual rotor current available from an alternator used in conjunction with the tester. The on/off condition of the indicator bulb, when the switch and various contact terminals are interconnected, provides an indication of the effective operation of the regulator. A volt meter can be included integrally with the tester to provide output readings of the regulator.

10 Claims, 4 Drawing Figures

AUTOMOTIVE ALTERNATOR AND SOLID STATE REGULATOR TESTER

This invention relates to a tester for a voltage regulator and, more particularly, to a tester circuit for testing solid state voltage regulators and alternators as are used in automobiles.

BACKGROUND OF THE INVENTION

Standard automobiles utilize alternators in conjunction with regulators to charge the automobile battery and provide the necessary energy for the numerous electrical equipment contained within the vehicle. As additional electrical equipment is included in the vehicle, there are frequent problems arising with the electrical circuitry within the vehicle. In many cases, the problem is due to a defective regulator or an electrical problem in the alternator. It is, therefore, desirous to first be able to test the voltage regulator as well as the alternator to determine whether defects exist therein. However, it is difficult to obtain proper test equipment which is portable and inexpensive and which can be used either directly within the vehicle or on the bench in the repair shop. Furthermore, such testing equipment must be easy to use and provide fast checking since prolonged testing may damage a good regulator and alternator. Additionally, since at present, some alternators include built-in solid state regulators, it is necessary to provide a universal tester, which can be utilized on all types of solid state regulators, including those which are built-in to the alternator.

Accordingly, it is an object of the present invention to provide a tester for a solid state voltage regulator and alternator which avoids the aforementioned problems of prior art devices.

A further object of the present invention is to provide a tester for a solid state voltage regulator built-in to an alternator.

A further object of the present invention is to provide a tester for a solid state regulator and alternator which reproduces exact on-car conditions for testing the regulator and alternator.

Still a further object of the present invention is to provide a tester for a solid state voltage regulator and alternator which is easy to operate and quickly provides the determination of the effectiveness of the regulator and alternator.

Yet another object of the present invention is to provide a tester for a solid state voltage regulator and alternator which is inexpensive to manufacture and provides accurate results.

Yet a further object of the present invention is to provide a tester for a solid state voltage regulator and alternator which utilizes an indicator bulb for determination of the effectiveness of the regulator, thereby providing an easily readable indicator.

These and other objects, features and advantages of the invention will, in part, be pointed out with particularity, and will, in part, become obvious from the following Description of the Invention, taken in conjunction with the accompanying drawings, which form an integral part thereof.

SUMMARY OF THE INVENTION

Briefly, the invention provides a tester for a solid state voltage regulator of the type that includes at least two output contacts. The tester circuitry includes two circuit branches, one of which has a parallel combination of a resistance means and an indicator light bulb means. One end of the two circuit branches are interconnected to each other and adapted to be connected to a voltage source. The other ends of the branches are respectively connected to the two output contacts of the voltage regulator. A switch is included in one of the circuit branches. If the regulator is built-in to the alternator, the field of the alternator will be used to provide the voltage for the regulator. If the regulator is independent of the alternator, actual rotor current will be provided from a test field of an alternator, which is sent to the voltage regulator. The tester circuit is enclosed within a housing, which includes floating contacts on the housing to which the regulator is coupled and held in place by clamp arrangement. An additional shorting switch, included to provide additional testing to the regulator, is located in a position on the housing to provide fail safe operation of the tester.

BRIEF DESCRIPTION OF THE DRAWING

In the drawing.

In the various figures of the drawings, like reference characters designate like parts.

DESCRIPTION OF THE PREFERRED EMBODIMENTS

Figure 1:
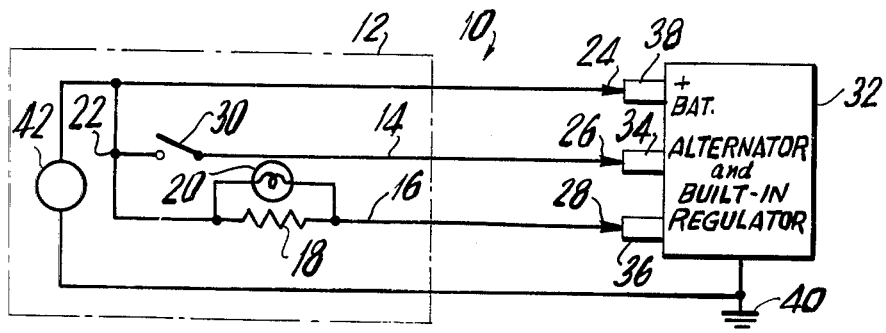
FIG. 1 is a schematic circuit diagram of one embodiment of the invention wherein the regulator is built in to an alternator.

Referring now to FIG. 1 there is shown the tester of the present invention 10 contained within a housing 12 and including a first circuit branch 14 and a second circuit branch 16. Circuit branch 16 includes a resistance 18 and parallel with an indicator light bulb 20. In a preferred embodiment of the present invention, the resistance 18 is a 10 ohm resistor. The first and second circuit branches 14 and 16 are interconnected at 22 and coupled to a first terminal 24. The other ends of the first and second circuit branches 14 and 16 are respectively connected to terminals 26 and 28. A switch such as a single pole single throw toggle switch 30, is serially interconnected into one of the circuit branches. In FIG. 1 it is shown serially interconnected in circuit branch 14.

The tester 10 is available for testing a solid state voltage regulator utilized in a vehicle and of the type which is built-in to an alternator, shown generally, at 32. The alternator typically includes two output terminals from the regulator 34 and 36. Additionally, a battery terminal 38 is available and a ground terminal 40 is also included. The battery terminal 24 of the tester can either be connected directly to the vehicle battery or can be connected to the battery terminal 38 of the alternator. The terminals 26 and 28 are interconnected respectively to the output terminals 34 and 36 of the regulator included within the alternator. Such alternators including built-in solid state regulators are presently available from the Delco Corporation.

To test the alternator utilizing the tester as shown in FIG. 1, the terminals are connected, as indicated, and with the switch 30 in an open position, the light 20 must be off. The switch 30 is then closed and the light 20 should go on. With the switch 20 retained in its closed position, the engine or motor is started and the speed is increased. When the speed reaches approximately 700 RPM the indicator bulb should go out and remain out. The engine is then stopped and the light should again go on as the speed of the engine reduces to a value less than 700 RPM. When the switch is opened the light must again go off. Any results other than recited indicates that a problem exists in the alternator or in the regulator included therein. Furthermore, if the light flickers rather than going fully on or fully off, there is also provided an indication that a problem exists.

The above testing procedure will provide indications of the appropriate field continuity of the alternator as well as the field resistance and the field ground. It also provides a check of the internal connections through the regulator and the field, and indicates that the field current switching transistor is turned on. The tester also checks the blocking action of any arc suppression diode, which may be included in the regulator as is well known in the art.

As is well known in the art, included within the alternator is a rectifier and, typically, a diode bridge rectifier. If a defect exists in one of the positive diodes of the rectifier bridge, then there will be no light indication provided or an extremely low glow will exist when the switch is closed. Furthermore, there will be a low charging rate typically, a half a volt below the rated output through the regulator. If a defect exists in one of the negative diodes of the rectifier bridge, then a normal light indication will be provided. However, there will also be a low charging rate and after the test, when the switch is open, the light will be on. If a defective circuit exists in the regulator, the light remains on when the switch is open. During rotation, the light will go out and the charging rate will be normal. Results different than those expected will also indicate the presence of faulty diodes, intermittent connections or open stators and terminals.

A voltmeter 42 can be included between the positive and negative terminals of the battery to detect the charging of the battery and to detect overcharging conditions. Such a voltmeter can be integrally included within the housing of the tester or terminals could be provided from the tester to interconnect to a separate voltmeter unit.

By utilizing a light indicator bulb rather than a meter, it is easier to detect the proper operation of the circuitry. Additionally, the light serves as an indicator whereas meter damping would not, in most cases, indicate the fluctuating voltage. The circuit of FIG. 1 can be utilized either on a test bench with the alternator removed from the vehicle or, alternately, could be used in field testing of the alternator in the vehicle itself. The terminals 26 and 28 can be included into a single plug which is adapted to fit into the alternator and resembles the plug utilized in the vehicle itself. The terminal 24 can be an alligator clip type of plug, which can easily hook onto the battery terminal of the alternator.

Figure 2:
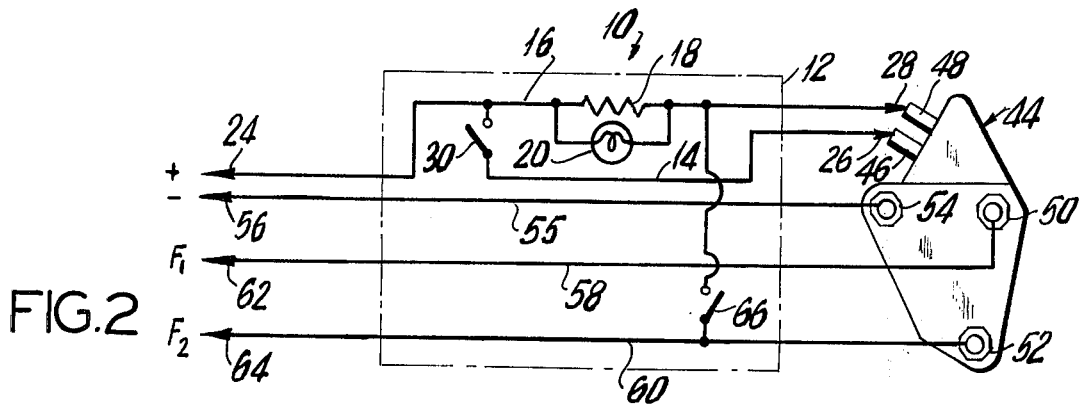
FIG. 2 is a schematic circuit diagram of another embodiment of the invention wherein the regulator is independent of the alternator.

Referring now to FIG. 2 there is shown a second embodiment to the present invention for testing a solid state regulator, which is separate from the alternator and can be tested independently thereof. Such regulators are available such as the Delco Remy-type voltage regulator. In this case, the tester reproduces exact on-car conditions to test the voltage regulator and simulates the conditions the regulator would normally see in the vehicle. The voltage regulator, shown generally at 44 includes the two output terminals 46 and 48 and additionally includes three internal contact terminals 50, 52 and 54 to which the alternator field and ground are usually connected. In the present embodiment, the tester includes a ground line 55 which is available to interconnect to terminal 54 of the voltage regulator and has an external terminal connection 56 which is connected to the negative or ground side of the voltage battery. Field lines 58, 60 are available to interconnect to the field contact terminals 50, 52 of the voltage regulator and at the other end thereof coupled to terminal connections 62, 64 which can be connected to the field winding of a bench alternator used for testing. A second switch 66, typically a push button type switch, is interconnected between one of the field lines 60 and the circuit branch 16. The switch 30 is in this embodiment placed in series with the circuit branch 14. To test the regulator utilizing the tester shown in FIG. 2, the battery and ground terminals 24, 56 are connected across the battery being utilized for testing. The field terminals 62, 64 are connected to the field wires of the alternator being used for testing purposes. The regulator is mounted to the tester such that the terminal 54 connects to the ground line 55, and the terminals 50, 52 connect respectively to the field line 58, 60. The terminals 26, 28 are then respectively connected to the output contacts of the voltage regulator 46, 48.

The testing procedure for the voltage regulator is as follows: With the switch 30 in the open position, the indicator light 20 should remain off. If it comes on, the regulator is defective. The switch 30 is then closed and the indicator light should turn on, thereby indicating a proper continuity through the regulator. If the light does not come on, the regulator is defective. The test alternator is then started up at a moderate speed. With a fully charged battery, the amperage should be between 9 and 10 amps. The voltage should then be controlled between approximately 14.4 and 14.6 volts. A voltmeter would be utilized to measure the necessary voltage. Such a voltmeter could be included in the tester as shown in FIG. 1 or alternately could be a separate instrument on the test bench. However, an output of over 15 volts may result in component damage due to overheating in the alternator in which the regulator is normally installed. In addition, a voltage of less than 14.4 may result in a low battery condition on the car in which the regulator is installed. The test alternator is then stopped and the terminal connections 26, 28 removed from the regulator contact 46, 48. The indicator light 20 should then turn off. Switch 66 is then closed. If the indicator light 20 goes on, the regulator is defective.

The foregoing testing procedures should take approximately 30 seconds to complete. Any prolonged testing of the voltage regulator may damage the diodes of the regulator due to overheating.

Referring now to FIG. 3, there is again shown a variation in the basic circuitry for use with other types of alternators. While the plugs, 24, 26 would be available for the Delco type voltage regulator which is an integral part of the alternator, additional testing lines 70, 72 with terminals 74, 76 are provided for external voltage controlled alternator field bypass. The line 70, 72 are placed across the parallel combination of the resistor 18 and the indicator light bulb 20.

Figure 3:
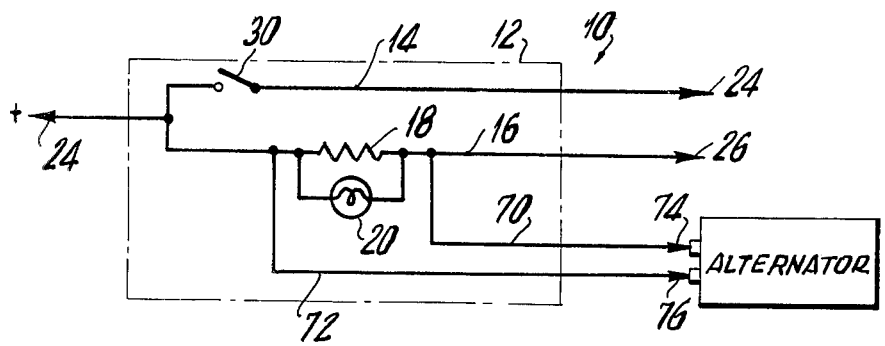
FIG. 3 is a schematic circuit diagram of a third embodiment of the invention providing the facility for testing external voltage control alternators.

In utilizing the embodiment of FIG. 3, the indicator light bulb is normally off when the alternator is not running. On the other hand, when the alternator is charging to its maximum amount, the indicator light will turn on very brightly. If the light is on the alternator is not running, there is an indication of a defect in the alternator. On the other hand, if the alternator voltage is at a maximum and the light does not come on, again there is provided an indication that the alternator is defective. If the alternator voltage does not reach its maximum and the light turns on rather dimly, again the alternator is defective. If the alternator produces grinding sounds, as it is running, even though all other indications are normal, there is again an indication that the alternator is defective.

The type of terminals provided at 74, 76 would depend on the type of alternator being utilized for specific types of vehicles. Thus, either male type plugs or female plugs could be utilized or alligator clips could also be provided. With the embodiment shown in FIG. 3, the tester can be utilized with Chrysler type vehicles either with one field or with two fields. When the two field type of alternator is utilized, one field must be ground to the alternator. On Ford type alternators, the embodiment of FIG. 3 could also be utilized connecting one of the terminals to the field and one terminal to the stator connection on the alternator.

Figure 4:
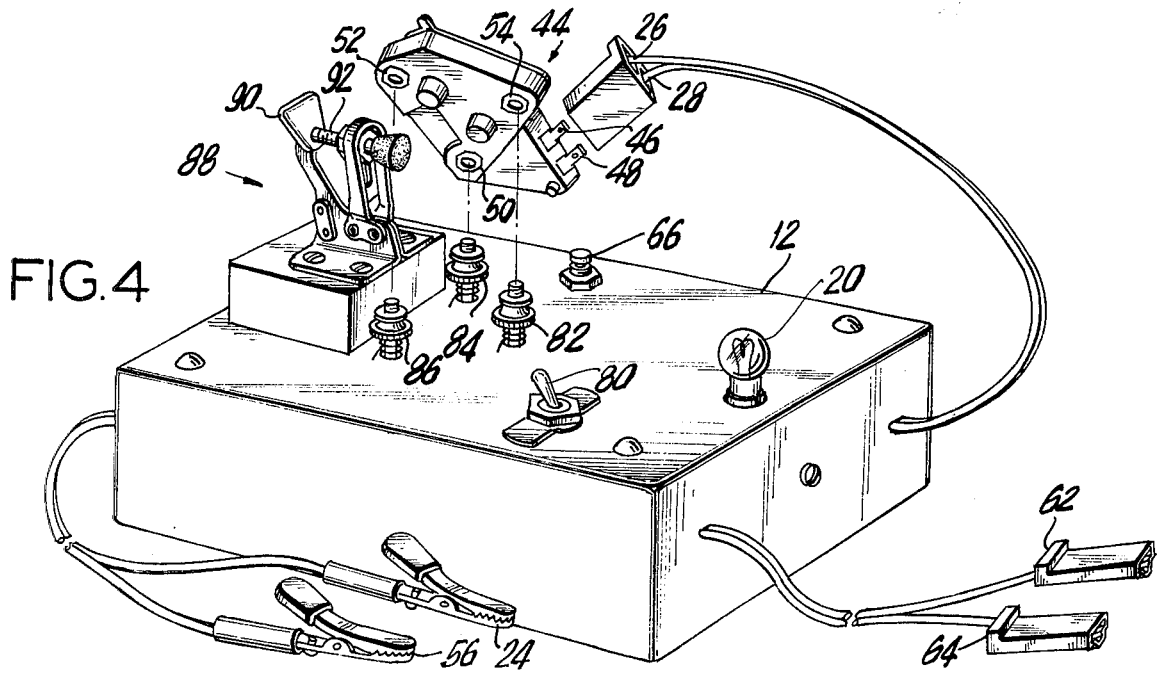
FIG. 4 is a perspective illustration of the tester in accordance with one embodiment of the present invention.

Referring now to FIG. 4, there is shown one embodiment of the housing retaining the circuitry shown in the embodiment of FIG. 2. The circuitry is included within the case 12 with the switch 30 connected to a toggle switch 80 and the switch 66 shown as a push button switch. The ground line 55 is connected to a floating contact terminal 82 and the field lines 58 and 60 are connected respectively to floating contact terminals 84 and 86. The free floating contact terminals are spring loaded to permit the voltage regulator to be depressed thereon. A clamping device shown generally at 88 includes a fingertip control handle 90 and a pressure arm 92. The battery terminals 24, 56 are shown as alligator type terminals and the field terminals 62, 64 are shown as female type connections. The terminals 26, 28 are connected into a double female plug.

The voltage regulator 44 is shown positioned over the free floating terminals such that contact 54 will interconnect with terminal 82, contact 50 with terminal 84 and contact 52 with terminal 86. The clamping device will then push down onto the voltage regulator to clamp it tight onto the floating contacts. The terminal plugs 26, 28 will then be connected onto the output contacts 46, 48 of the voltage regulator. The testing of the voltage regulator will then proceed in accordance with the above described testing procedure.

It is noted that during the course of the testing, the only time that the switch 66 is utilized is when the plugs, 26, 28 are removed from the voltage regulator. In FIG. 4, it is noted that the switch 66 is positioned on the housing such that when the voltage regulator 44 is clamped onto the floating terminals and the plugs 26, 28 are connecting the contacts 46, 48 of the voltage regulator, the button 66 will be inaccessible since it will be located directly under the plug 26, 28 and slightly spaced therefrom. The only time that the button 66 will be available will be after the plugs 26, 28 are removed from the voltage regulator and the button 66 is then accessible for closure. This provides a fail-safe testing procedure such that the switch 66 will not be depressed while the plugs 26, 28 are connected to the voltage regulator.

It is therefore seen that the above described voltage regulator tester provides a simple, fast and reliable testing procedure for solid state voltage regulators as well as the alternators as are used in vehicles. The device is compact and small enough to be held in the hand. Furthermore, it is available for testing the alternator and solid state regulators whether or not they are integral with the alternator or independent thereof and regardless of the type of vehicle from which the voltage regulator has been removed. Furthermore, the simplicity of the circuitry provides extremely low cost testing equipment. Additionally, when the regulator is available for testing independently of the alternator, the tester provides simulated rotor current to duplicate conditions which the regulator is normally subject to in the vehicle.

There has been described heretofore the best embodiment of the invention presently comtemplated. However, it is to be understood that various changes and modifications may be made thereto without departing from the spirit of the invention.

What I claim as new and desire to secure by letters Patent is:

1. A tester for a solid state voltage regulator and/or associated alternator having two outputs, comprising:
   first and second circuit branches; said first circuit branch including, in parallel combination, resistance means and indicator light bulb means continuously connected in said first circuit;
   first terminal means adapted to be interconnected to a battery source;
   second and third output terminal means adapted to interconnect respectively to said regulator output contacts;
   one end of said first and second circuit branches being interconnected and the interconnection coupled to said first terminal means;
   the other ends of said first and second circuit branches respectively being simultaneously coupled to said second and third output terminal means, and normally open switch means serially interconnected only in said second circuit branch.

2. The tester as in claim 1 and wherein said regulator is built into an alternator having a battery contact and wherein said first terminal means is adapted to be coupled to to said battery contact.

3. The tester as in claim 1 and wherein said regulator includes three internal contacts, and wherein said testing circuit further comprises first and second field lines adapted to interconnect two of said internal contacts to an alternator field, a ground line adapted to interconnect the third of said internal contacts to a ground connection, and a second switch means interconnecting one of said field lines to said first circuit branch.

4. The tester as in claim 3 and further comprising housing means, said first and second circuit branches, said first and second field lines, and said ground lines all located within said housing means, both said switch means available externally of said housing means, and further comprising three floating contact means located on the outside of said housing means being respectively electrically connected to said field lines and said ground line, and clamp means located on said housing means and positioned to clamp the regulator onto said housing means such that said three internal contacts are coupled to said three floating contact means.

5. The tester as in claim 4 and wherein said second switch means is positioned adjacent said floating contact means such that when said regulator is in a clamped position and said second and third terminal means are interconnected to said regulator output contacts, said second switch means is inaccessible.

6. The tester as in claim 5 and wherein said second switch means is a push button switch.

7. The tester as in claim 1 and wherein said resistance is a 10 OHM resistor.

8. The tester as in claim 1 and wherein said switch means is a single pole, single throw, toggle switch.

9. The tester as in claim 1 and further comprising a fourth terminal means adapted to be connected to the low side of the battery source, and a voltmeter interconnected between said first terminal means and said fourth terminal means.

10. The tester as in claim 1 and further comprising fourth and fifth terminal means connected in parallel across said resistance means for interconnection to an alternator having an external voltage control means.

\* \* \* \* \*